United States Patent
Lorenz (10) Patent No.: US 6,600,678 B1
(45) Date of Patent: Jul. 29, 2003

(54) CIRCUIT FOR READING MEMORY ELEMENTS

(75) Inventor: Perry Scott Lorenz, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/020,340

(22) Filed: Dec. 11, 2001

(51) Int. Cl.[7] ............................................... G11C 7/00
(52) U.S. Cl. .............. 365/189.01; 365/226; 365/189.04
(58) Field of Search .................... 365/189.01, 233.5, 365/241, 227, 189.08, 226, 189.09, 189.04

(56) References Cited

U.S. PATENT DOCUMENTS

| | | | | |
|---|---|---|---|---|
| 5,410,680 A | * | 4/1995 | Challa et al. ................. | 703/24 |
| 5,808,933 A | * | 9/1998 | Ross et al. ................... | 365/154 |
| 5,917,358 A | * | 6/1999 | Sanchez et al. ............. | 327/333 |
| 6,188,615 B1 | * | 2/2001 | Perner et al. ................ | 365/100 |

* cited by examiner

Primary Examiner—Thong Q. Le
(74) Attorney, Agent, or Firm—Merchant & Gould P.C.

(57) ABSTRACT

A system and method for reading memory elements (e.g., PROMs). The system includes memory elements, a write circuit, and a read circuit. The write circuit is configured to store a charge on one of the memory elements representing a data value. The read circuit is configured to continually detect the charge stored on the memory element and to continually translate the charge into a logic value indicative of the data value when the system is powered on. The read circuit includes a current steering circuit and a detection and translation circuit. The current steering circuit may include a current source coupled to a differential pair, which direct the flow of a current through the memory system based on the stored charge. The detection and translation circuit may include three mirrors, which are configured to detect the current and output the logic value at one of two rails.

21 Claims, 5 Drawing Sheets

Fig. 5

CIRCUIT FOR READING MEMORY ELEMENTS

TECHNICAL FIELD

The present invention relates to non-volatile memory elements, and more particularly to circuits for reading non-volatile memory elements.

BACKGROUND OF THE INVENTION

Many electronic systems include memory devices. The memory devices are often used to store critical information that is needed by the electronic system. In some instances it is necessary for the memory device to provide non-volatile storage. Non-volatile memories allow for information to be permanently or semi-permanently stored such that removing power from the memory does not destroy the stored information. Example non-volatile memory devices include Erasable Programmable Read Only Memory (EPROM) as well as others.

The trend in the electronics industry is to reduce overall power consumption in electronic systems. This trend is largely due to the proliferation of battery powered electronic systems. In an effort to preserve battery life, battery powered devices require their electronics to consume less power under operation. Because electronics are often disabled to conserve power, non-volatile memory devices are well suited to preserve any critical information required by the electronics.

To further preserve power, read circuits typically read the memory devices at power-up and then latch the data. However; reading the memory devices at power-up requires the read circuit to interact with support circuitry. One such support circuit is a sensing circuit that detects and retriggers the read circuit when the power drops to a low voltage. Another support circuit is a bias sensing circuit that detects when a correct bias voltage is established before initiating the read cycle. In addition, the bias sensing circuit may detect when the reading of the memory device is complete.

While these prior designs worked, the read circuits and accompanying support circuitry were quite complex and consumed a significant area on the die. In addition, even though the read circuit itself appeared to consume low power because it was only on during the read cycle, the support circuitry used significant current.

SUMMARY OF THE INVENTION

The present invention provides a static memory system having a read circuit that allows memory elements to be continually read. Because the read circuit continually reads the memory elements, the present invention minimizes the amount of support circuitry. Thus, the read circuit in accordance with the present invention consumes less die area and consumes less power than prior read circuit designs.

In one embodiment, the static memory system includes two memory elements, a write circuit, and a read circuit. The write circuit is configured to store a charge on one of the memory elements. The charge represents a data value for a respective bit. The read circuit is configured to continually detect the charge stored on the memory element and to continually translate the charge into a logic value indicative of the data value. The read circuit performs the continual detection and translation while the static memory system is powered on.

In one aspect of the invention, the read circuit includes a current steering circuit and a detection and translation circuit. The current steering circuit is configured to direct a flow of a current through the read circuit. The direction of the flow depends on which memory element is storing the charge. The detection and translation circuit is coupled to the current steering circuit and is configured to detect the current and translate the current into the logic value.

In another aspect of the invention, the detection and translation circuit includes a first current mirror, a second current mirror, and a third current mirror. The current mirrors are configured to output the logic value at a voltage level corresponding to a voltage at one of two rails. In a further refinement, the static memory system includes an inverter. The current mirrors and the inverter are configured in a manner to disallow feed through current through the inverter.

In yet another aspect of the invention, the current steering circuit includes a current source coupled to a differential pair. The differential pair may include the two memory elements or may include a first and a second transistor that have dimensions similar to the two memory elements.

In still another aspect of the invention, the static memory system further includes a first and a second cascode transistor. The first cascode transistor is coupled to the differential pair and the first current mirror. The second cascode transistor is coupled to the differential pair and the third current mirror. Both the first and second cascode transistors are biased at a substantially constant voltage and are configured to prevent an accidental write to their respective memory elements.

In another embodiment of the invention, the static memory system includes a first circuit and a second circuit. The first circuit continually steers a current through the memory system while the memory system is powered on. The second circuit continually detects the current and translates the current into a logic value representing a data value stored in the memory system while the memory system is powered on. In a further refinement, the first circuit includes a current-source transistor that has a gate biased at a first substantially constant voltage. The source of the current-source transistor is coupled to a power supply. The current-source transistor conducts a substantially constant current. The second circuit includes a first current mirror, a second current mirror, and a third current mirror. The current mirrors are configured to output the logic value at a voltage level corresponding to a voltage at one of two rails.

In one aspect of the invention, the circuit further includes an inverter. The inverter and the current mirrors are configured in a manner whereby feed through current does not flow through the inverter.

In yet another embodiment, the present invention provides an apparatus for reading memory systems. The apparatus includes a current steering means, a detection means, and a translation means. The current steering means continually directs a flow of a current through the memory system while the memory system is powered on. The detection means continually detects the current based on a charge that is stored on a memory element while the memory system is powered on. The translation means continually translates the current into a logic value indicative of a data value when the memory system is powered on.

In still another embodiment, the present invention provides a method for reading a memory device. The method includes generating a substantially constant current, directing the current to flow continually through a differential pair and at least three current mirrors. The direction of current flow is based upon which of the memory elements is storing a charge. The charge represents a data value. The method further includes detecting the current continually in the at least three current mirrors and continually translating the detected current into a logic value representing the data value.

DETAILED DESCRIPTION OF THE PREFERRED EMBODIMENT

As an overview, a read circuit in accordance with the present invention allows data written in a memory element to be continuously read and available. Thus, the circuit, in accordance with the present invention, eliminates the need for support circuitry that detects when a read should occur and when the read should end.

Figure 1:
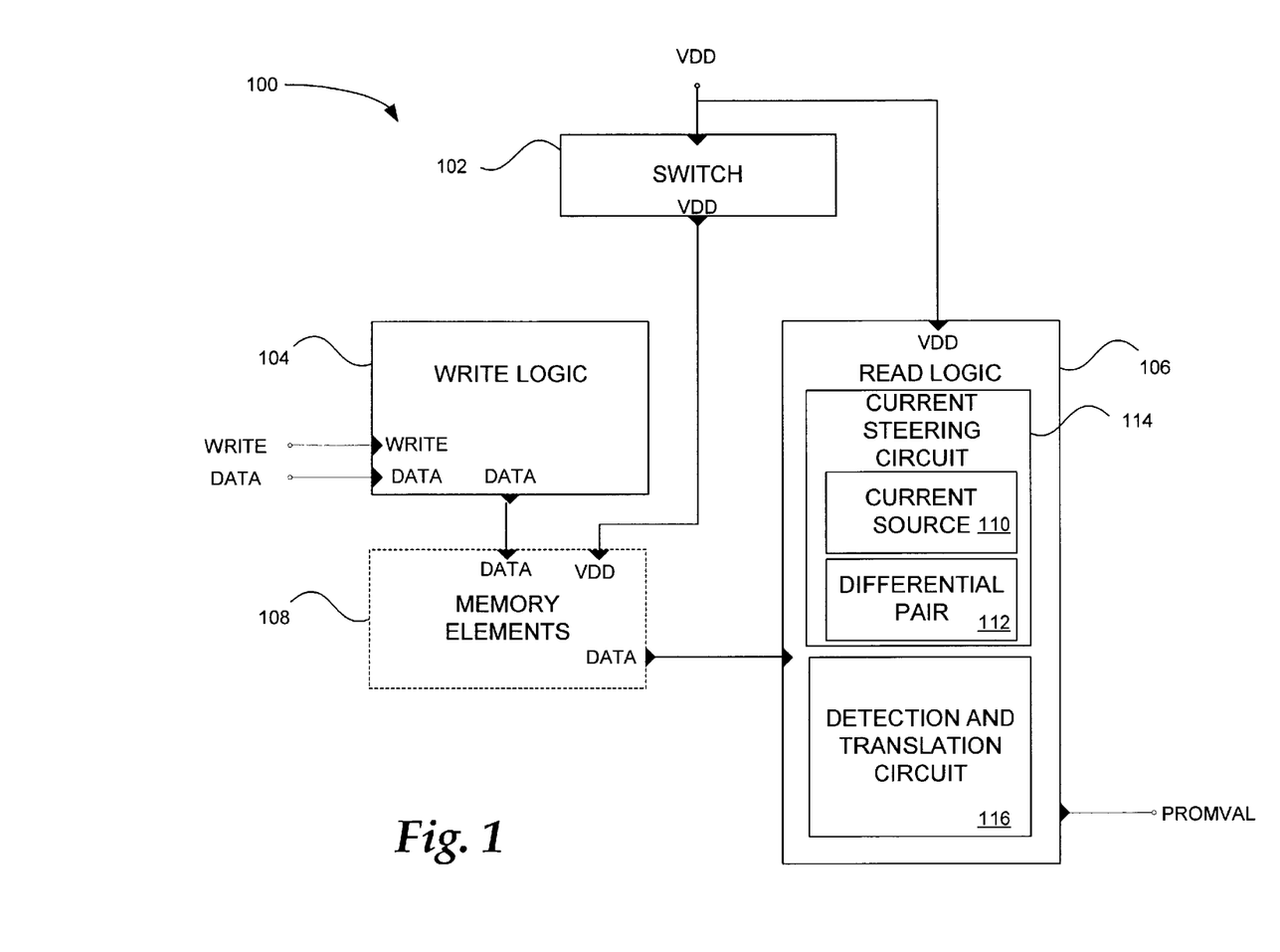
FIG. 1 is a block diagram illustrating a functional overview of one embodiment of a static memory system.

FIG. 1 is a block diagram illustrating a functional overview of one embodiment a static memory system 100 in accordance with the present invention. In this embodiment, the static memory system 100 includes a switch 102, write logic 104, read logic 106, and memory elements 108. The switch 102 is coupled to a power supply voltage (VDD) and to memory elements 108. The memory elements 108 are also coupled to write logic 104. The switch 102 enables the write logic 104 to write the associated memory elements 108 (shown in phantom). The write logic 104 is configured to store a charge on at least one of the associated memory elements 108. The charge that is stored represents a data value (i.e., a "1" or a "0").

Read logic 106 is configured to continually determine which memory element 108 is written and to output a signal PROMVAL indicative of the data value that is stored. The read logic 106 is coupled to the power supply voltage (VDD). Because read logic 106 is coupled to the power supply voltage (VDD), the read logic 106 continues to read even when the write logic 104 is enabled. Thus, the static memory system 100 of the present invention does not require support circuitry for determining when a read should occur or when the read should end.

The read logic 106 includes a current source 110, a differential pair 112, and a detection and translation circuit 116. The current source 110 supplies a predetermined current to the differential pair 112. In one embodiment, the differential pair 112 includes memory elements 108 (shown in phantom). The current source 110 in conjunction with the differential pair 112 steer the predetermined current so that a detection and translation circuit 116 may properly determine the data value that is stored. The combination of the current source 110 and the differential pair 112 may be referred to as a current steering circuit 114. The current steering circuit 114 is coupled to the detection and translation circuit 116. Once the current steering circuit 114 properly directs the flow of the predetermined current, the detection and translation circuit 116 detects which memory element 108 is written and outputs a corresponding signal PROMVAL.

Figure 2:
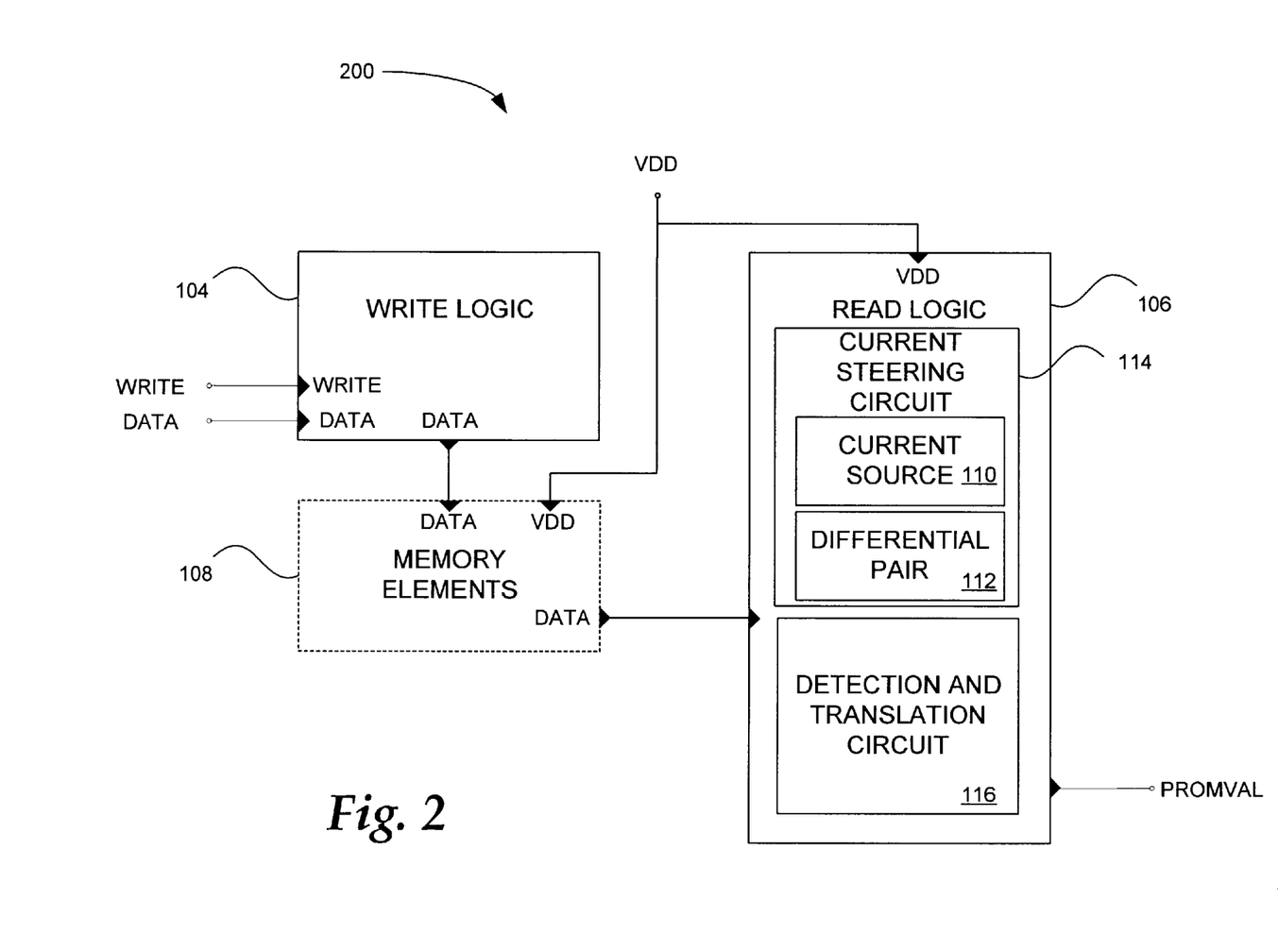
FIG. 2 is a block diagram illustrating a functional overview of another embodiment of a static memory system.

FIG. 2 is a block diagram illustrating a functional overview of another static memory system 200 in accordance with the present invention. In this embodiment, the static memory system 200 again includes write logic 104, read logic 106, and memory elements 108. However, in this embodiment, switch 102 is not included. Instead, the power supply voltage (VDD) is coupled to the memory elements 108 and the write logic 104 includes circuitry for enabling the write operation. The configuration and operation of the read logic 106 is as described above for FIG. 1.

In both of the above embodiments, the memory elements 108 are continually read and the corresponding signal PROMVAL is continually output. As will be described in greater detail below, the read logic 106 remains on and continually establishes the data value. In contrast, prior read circuits would determine the data value and then latch the data value. Thus, because the read logic 106 remains on and the data value is available whenever the memory system is on, the memory system of the present invention is referred to as a "static" memory system.

Figure 3:
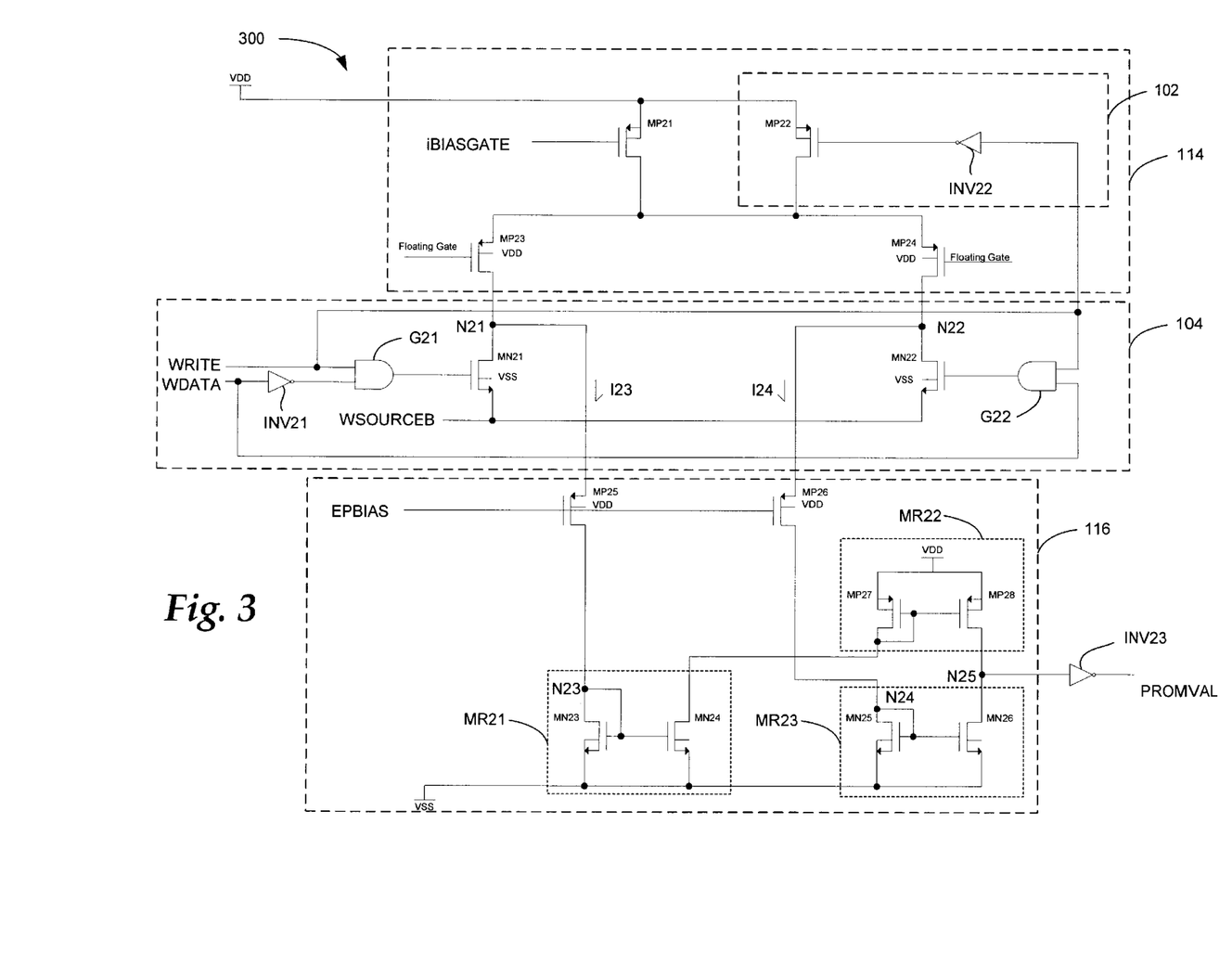
FIG. 3 is a schematic diagram illustrating one embodiment of a static programmable read only memory.

FIG. 3 is a schematic diagram illustrating one embodiment of a static memory system in accordance with the present invention. In the following discussion, the static memory system refers to a static programmable read only memory. The static memory system 300 includes two memory elements, PMOS transistors MP23 and MP24. Memory elements MP23 and MP24 have common sources connected to the drain of PMOS transistor MP21 and to the drain of PMOS transistor MP22. Transistor MP21 is configured as a current source. Transistor MP22 is configured as a switch. Hereinafter, transistors MP21 and MP22 may be referred to as current source MP21 and switching transistor MP22, respectively. Switch 102 (shown in FIG. 1) includes switching transistor MP22 and inverter INV22. The drain of memory elements MP23 and MP24 are connected to nodes N21 and N22, respectively. The gate of memory elements MP23 and MP24 are both floating.

Figure 5:
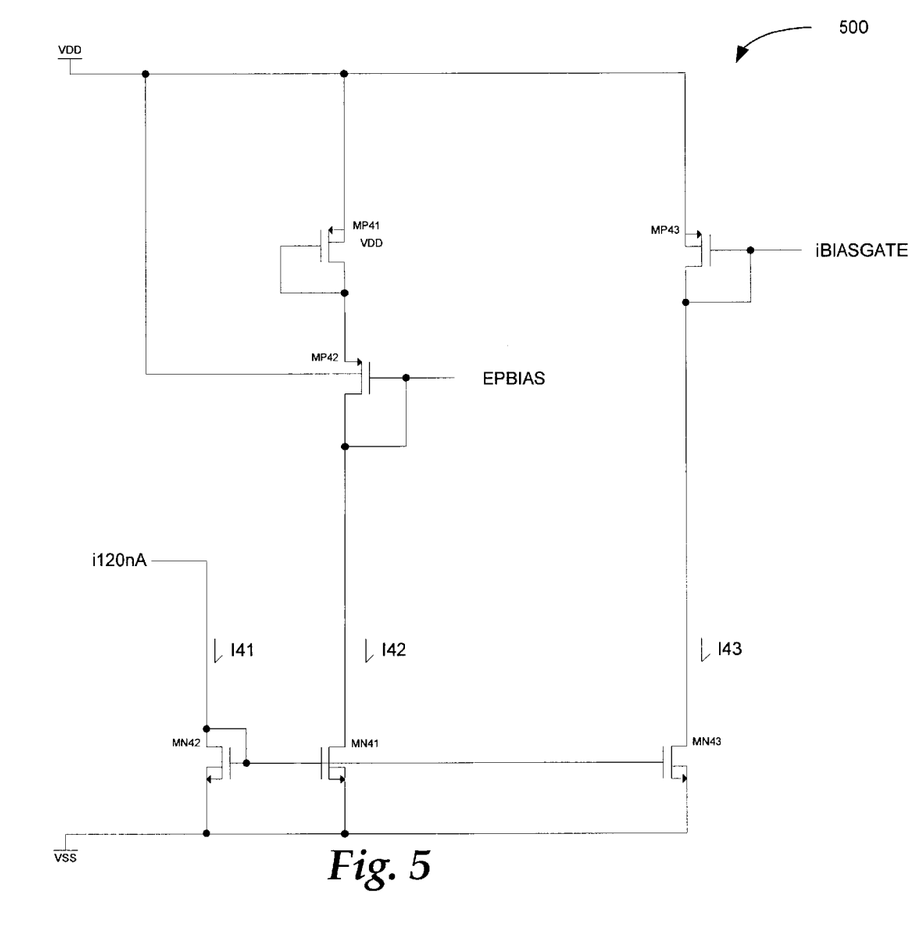
FIG. 5 is a schematic diagram illustrating one embodiment of a bias circuit for generating the bias voltages for use in the static programmable read only memory depicted in FIGS. 3 and 4.

The source of transistors MP21 and MP22 are connected to a power supply voltage (VDD). The gate of transistor MP21 is connected to a signal iBIASGATE. The generation of the signal iBIASGATE is illustrated in FIG. 5 and is described in further detail below. The gate of transistor MP22 is connected to the output of inverter INV22. The input of inverter INV22 is coupled to write logic (104, presented graphically within an outlined box in FIG. 3).

Write logic 104 is responsible for storing a charge on one of the two memory elements MP23 or MP24. While write logic 104 is not pertinent to the discussion of the continuous read circuit of the present invention, the configuration of the write logic 104 shown in FIG. 3 is described for those interested in the write operation of memory elements MP23 and MP24. Thus, for write logic 104 illustrated in FIG. 3, the drain of memory element MP23 is connected at node N21 to side A write logic and the drain of memory element MP24 is connected at node N22 to side B write logic.

Both side A and side B write logic include an NMOS transistor MN21 and MN22, respectively, and an AND gate G21 and G22, respectively. The drain of transistor MN21 is connected at node N21 to the drain of memory element MP23. The gate of transistor MN21 is connected to the output of AND gate G21. Inputs to AND gate G21 are a WRITE signal and an inverted WDATA signal representing the data (e.g., the "1" or "0") that is to be written. An inverter INV21 inverts the WDATA signal before the WDATA signal is input into AND gate G21. For side B write logic, the inputs to AND gate G22 are the WRITE signal and the WDATA signal. The output of AND gate G22 is connected to the gate of transistor MN22. The drain of transistor MN22 is connected at node N22 to the drain of memory element MP24. For both the side A and the side B write logic, the source of transistors MN21 and MN22 are connected to a WSOURCEB signal. When active, the WSOURCEB signal is at VSS. When inactive, WSOURCEB signal prevents the memory elements from being accidentally written. The WRITE signal is also input to inverter INV22 that is part of the switch 102 in this embodiment. The output of inverter INV22 is connected to the gate of transistor MP22.

A PMOS transistor MP25 has a source connected to node N21, a gate connected to EPBIAS and a drain connected to node N23. A PMOS transistor MP26 has a source connected to node N22, a gate connected to EPBIAS, and a drain connected to node N24. Detection and translation circuit (116, depicted in an outlined box) is coupled to nodes N23 and N24. The detection and translation circuit 116 includes three mirrors.

A first mirror MR21 includes two NMOS transistors MN23 and MN24. The source of transistors MN23 and MN24 is connected to VSS. The drain of transistor MN23 is connected at node N23 to the drain of transistor MP25. The gate of transistor MN23 is connected to the gate of transistor MN24 and to node N23. The drain of transistor MN24 is coupled to a second mirror MR22.

The second mirror MR22 includes two PMOS transistors MP27 and MP28. The source of transistors MP27 and MP28 is connected to VDD. The drain of transistor MP27 is connected to the drain of transistor MN24 of the first mirror MR21 and the gate of transistor MP27. The gate of transistor MP27 is also connected to the gate of transistor MP28. The drain of transistor MP28 is coupled to a third mirror MR23 at node N25.

The third mirror MR23 includes two NMOS transistors MN25 and MN26. The source of transistors MN25 and MN26 is connected to VSS. The drain of transistor MN25 is connected at node N24 to the drain of transistor MP26. The gate of transistor MN25 is connected to the gate of transistor MN26 and node N24. The drain of transistor MN26 is connected at node N25 to the drain of transistor MP28 of the second mirror MR22. An inverter INV23 is coupled at node N25 and provides a signal PROMVAL indicative of the data that is stored in the memory device 200.

The operation of memory system 300 will now be described. Even though the write operation is not pertinent to the discussion of the continuous read operation of the present invention, a brief description is provided for those interested in the write operation of the memory elements MP23 and MP24. In overview, for each bit of data that is to be stored in the programmable read only memory, two memory elements (e.g., MP23 and MP24) are used. Then, if the data is a "1", for example, memory element MP24 may be written. In contrast, if the data is a "0", memory element MP23 may be written. Of course, the assignment of "1" and "0" may be reversed. In either case, one memory element is written and the other is not.

Thus, when the write operation occurs, WRITE signal goes high and activates switching transistor MP22. Switching transistor MP22 provides power supply voltage VDD to the source of memory elements MP23 and MP24. In addition, WRITE signal allows either transistor MN21 or MN22 to become active depending on the WDATA signal. Thus, transistors MN21 and MN22 act as switches and allow the current to flow on their respective sides through WSOURCEB to VSS. Thus, the side that allows the current and is controlled by either MN21 or MN22 results in the writing of the corresponding memory element. The write operation drives a charge into the gate oxide and the gate of the selected memory element (MP23, MP24). When the charge is injected into the gate oxide, the transistors (MP23, MP24) act as memory devices storing charge.

Once one of the memory elements MP23 or MP24 is written and the WRITE signal goes low, switching transistor MP22 is deactivated and the write operation is completed. As one skilled in the art will appreciate, when memory system 300 performs a write operation, the read operation is disrupted. Therefore, the memory system 300 of the present invention performs the continuous read operation whenever the memory system is powered on, except for when the write operation causes the disruption.

During the continuous read operation, current source MP21 provides a predetermined current (e.g., 20 nA). The memory element (MP23 or MP24) having the charge stored on its respective gate and gate oxide will have a larger gate-to-source voltage and will steer the 20 nA in its direction. Thus, memory elements MP23 and MP24 function as a differential pair, more specifically in this case, a differential switch.

Now, for example, assuming that memory element MP23 has been written, the current I23 (e.g., 20 nA) flows through memory element MP23 and onward to transistor MP25. Transistor MP25 is a cascode and is biased by the signal EPBIAS. EPBIAS is maintained at a substantially constant voltage. Cascode transistor MP25 prevents a large source-to-drain voltage across memory element MP23 during the continuous read. This prevents memory element MP23 from being written inadvertently during the continuous read. Current I23 then continues flowing to the first mirror MR21 in the detection and translation circuit 116. The first mirror MR21 reflects the current up to the second mirror MRR22. The second mirror MR22 reflects the current down into node N25. Because current I24 is substantially zero, the third mirror MR23 does not have any current to reflect up into node N25. Thus, node N25 is pulled high (i.e., VDD). Transistor MP28 in the second mirror MR22 will no longer conduct current once node N25 is pulled high. However, transistor MP28 holds node N25 against its rail (i.e., VDD). The signal PROMVAL is then low. In summary, when memory element MP23 is written, the signal PROMVAL indicates the data value "0".

In contrast, now assuming that memory element MP24 has been written, current I24 (e.g., 20 nA) flows through memory element MP24 and onward to transistor MP26. Similar to transistor MP25, transistor MP26 is a cascode and is biased by the signal EPBIAS which is substantially constant. Cascode transistor MP26 prevents memory element MP24 from being written inadvertently during the continuous read. Current I24 continues flowing to the third mirror MR23 that reflects the current up into node N25. The second mirror MR22 does not have any current so node N25 goes low (i.e., VSS). This results in the signal PROMVAL representing a high. Thus, when memory element MP24 is written, the signal PROMVAL indicates the data value "1".

As one skilled in the art will readily recognize, in the first example when memory element MP23 has been written, the first mirror MR21 reflects 20 nA up to the second mirror MR22. Thus, there is a combined 40 nA flowing in the memory device 200. However, in the second example when memory element MP24 has been written, the combined current is 20 nA. In either case, the combined currents are very low and use considerably less current than some of the support circuitry in the prior art. For example, some of the prior art circuitry used currents in the range of approximately 4 µA. Thus, the memory device 200 in accordance with the present invention can support over 100 bits before the memory device 200 consumes as much current as the support circuitry in the prior art.

The detection and translation circuit 116 is designed in such a manner that its output is either at one rail (e.g., VDD) or the other rail (e.g., VSS). By designing the detection and translation circuit 116 in this manner, the feed through current for inverter INV23 remains near zero.

Figure 4:
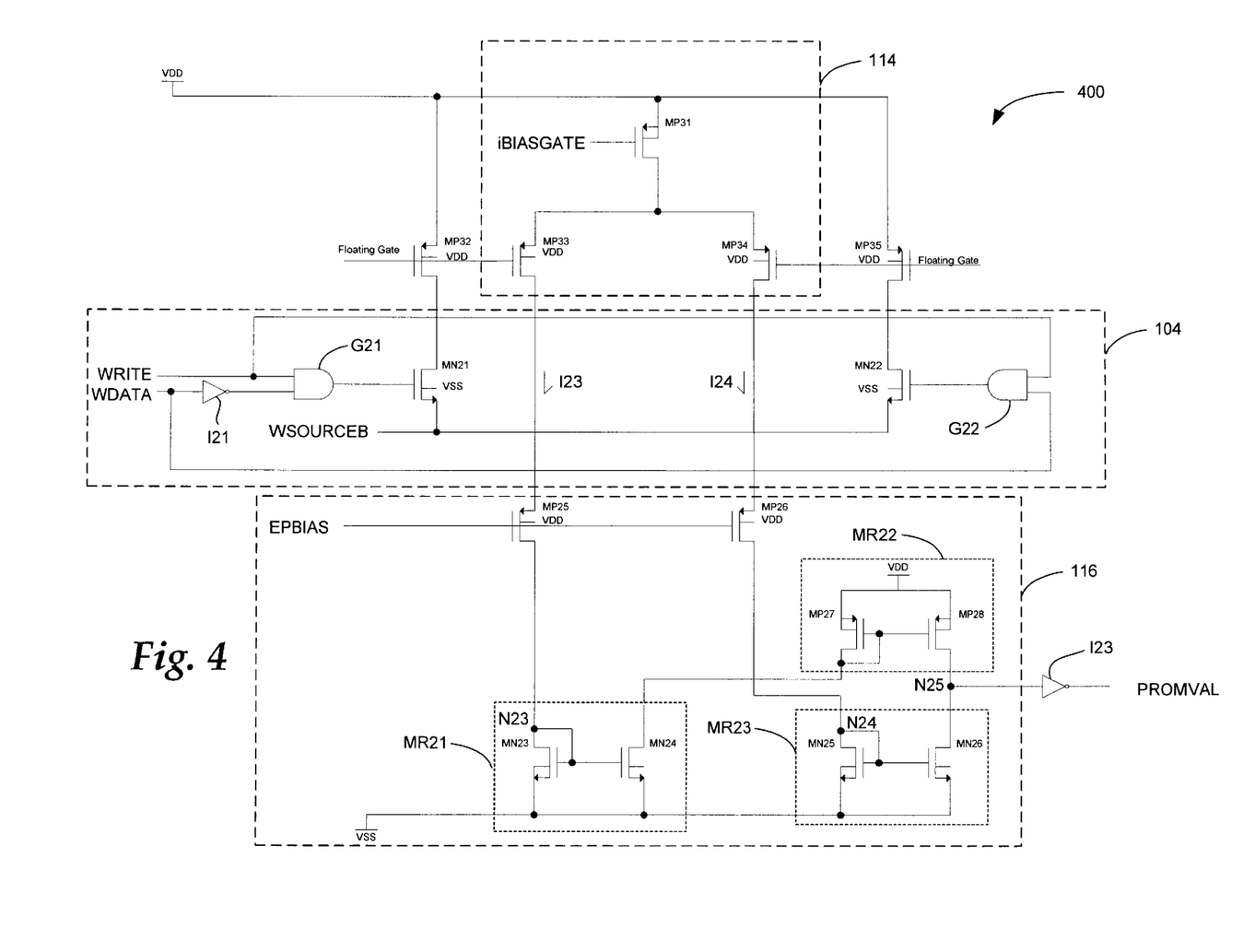
FIG. 4 is a schematic diagram illustrating another embodiment of a static programmable read only memory.

FIG. 4 is a schematic diagram illustrating an embodiment of the static memory system depicted in FIG. 2. In this embodiment, the static memory system 400 includes a current steering circuit 114, write logic 104, and a detection and translation circuit 116. The write logic 104 and the detection and translation circuit 116 are configured and function as described above for FIG. 3. Like reference numerals have been used throughout the view for like parts. The current steering circuit 114 is performed by a differential pair (112, shown in FIG. 2), in combination with current-source MP31. The differential pair 112 includes differential pair elements PMOS transistors MP33 and MP34.

Differential pair elements MP33 and MP34 have common sources connected to the drain of current-source MP31. The drains of differential pair elements MP33 and MP34 are coupled to the detection and translation circuit 116. In the embodiment shown, the drains of differential pair elements MP33 and MP34 are connected to cascode transistors MP25 and MP26, respectively. The gate of differential pair element MP33 is connected to the gate of memory element MP32, but is otherwise floating. Likewise, the gate of differential pair element MP34 is connected to the gate of memory element MP35, but is otherwise floating. The two memory elements MP32 and MP35 have common sources connected to the power supply voltage (VDD). The drains of memory elements MP32 and MP35 are both coupled to the write logic 104. In the embodiment shown, the drains of memory elements MP32 and MP35 are connected to the drains of transistors MN21 and MN22, respectively. The gate of current-source MP31 is connected to a signal iBIASGATE. The generation of the signal iBIASGATE is illustrated in FIG. 5 and is described in further detail below. The source of current-source MP31 is connected to the power supply voltage (VDD).

For this embodiment, the steering mechanism 114 includes the differential pair elements MP33 and MP34 and the current-source MP31. Thus, depending on which memory element is written, differential pair elements MP33 and MP34 will steer the current from the current source accordingly. Once the current is steered, the operation of the rest of the circuit shown in FIG. 4 is as explained above for FIG. 3.

For this embodiment, the write operation drives charge into a floating gate that is shared with a differential pair element. This results in twice the gate area. Thus, the voltage difference between the written pair and the unwritten pair may not be as large as in the first embodiment. However, the voltage difference in this second embodiment is still sufficient to be read reliably. In one exemplary design, the differential pair elements are ½ micron devices with offsets on the order of 30–70 mV. The voltage difference on the floating gates may be 1 V. Thus, even though this exemplary design has a larger offset than the embodiment shown in FIG. 3, the offsets are still small compared to the voltage difference. One advantage of this embodiment over the embodiment shown in FIG. 3 is that less die area is consumed. This is largely the result of not having the large switch (e.g., transistor MP22) driven by inverter INV22. In addition, this embodiment does not experience a voltage drop from transistor MP22 when writing.

FIG. 5 is a schematic diagram illustrating one embodiment of a bias circuit 500 for generating the two voltages iBIASGATE and EPBIAS for use in the memory systems depicted in FIGS. 3 and 4. Bias circuit 500 includes two diode-connected transistors in series MP41 and MP42. The source of transistor MP41 is connected to a power supply voltage (VDD). The drain of transistor MP41 is connected to the source of transistor MP42 and the gate of transistor MP41. The drain of transistor MP42 is coupled to one of a set of current mirrors. The gate of transistor MP42 is connected to the drain of transistor MP42 and provides the signal EPBIAS. The set of current mirrors includes transistors MN41, MN42 and MN43. The source of transistors MN41-MN43 is commonly connected to VSS. The drain of transistor MN42 is connected to a circuit that generates a predetermined current. For this embodiment, the predetermined current is 120 nA. The gate of transistor MN42 is connected to the drain of transistor MN42 and to the gate of transistor MN41. The drain of transistor MN41 is connected to the drain of transistor MP42.

The bias circuit 500 further includes a PMOS transistor MP43 for generating the iBIASGATE signal. The source of transistor MP43 is connected to the power supply voltage (VDD). The drain of transistor MP43 is connected to the gate of transistor MP43 and to the drain of transistor MN43. The gate of transistor MN43 is connected to the gate of transistor MN42. The pair of transistors MN43 and MN42 form the second mirror of the set of current mirrors. The gate of transistor MP43 provides the iBIASGATE signal.

In operation, the current I41 (e.g., 120 nA) is divided and reflected into two currents I42 and I43. When the dimensions of transistors MN41 and MN43 are identical and are half that of transistor MN42, the currents I42 and I43 will be identical (e.g., 60 nA). The current I43 is further reduced to 20 nA due to the dimensions of transistor MP43 in relation to transistor MP21 (FIG. 3) or MP31 (FIG. 4). The iBIAS-GATE signal may drive many memory circuits. The EPBIAS signal is two "diodes" down from the upper rail (VDD) and establishes the voltage on the cascode gates MP25 and MP26 in both FIGS. 3 and 4.

An illustrative example of dimensions for the transistors shown in FIGS. 3–4 is described below. Cascode transistors MP25 and MP26 have widths equal to 900 nm and lengths equal to 1 µm. The transistors for the first, second, and third current mirrors (i.e., transistors MN23–26, Mp27–28) have widths equal to 1 µm, lengths equal to 10 µm. The memory elements MP23 and MP24 have widths equal to 900 nm and lengths equal to 500 nm. Switching transistor MP22 has a width equal to 14 µm and length equal to 500 nm. Current-source MP21 has a width equal to 1 µm and length equal to 11 µm. Transistor MP43 represents three PMOS transistors in parallel, having widths equal to 1 µm and lengths equal to 11 µm. The dimensions ensure that the current I43 (e.g., 60 nA) will be properly reduced. As described above, currents I23 and I24 are 20 nA depending on which memory element is written. For the embodiment illustrated in FIG. 3, the two memory elements MP32 and MP35 and the two differential pair elements MP33 and MP34 have widths equal to 900 nm and lengths equal to 500 nm.

An illustrative example of dimensions for the transistors shown in FIG. 5 is described below. Transistor MP41 has a width equal to 900 nm and a length equal to 2 $\mu$m. Transistor MP42 has a width equal to 1 $\mu$m and a length equal to 10 $\mu$m. Transistors MN41 and MN43 have widths equal to 1 $\mu$m and lengths equal to 20 $\mu$m. Transistor MN42-3 represents two NMOS transistors in parallel, having widths equal to 1 $\mu$m and lengths equal to 20 $\mu$m. As described above, transistor MP43 represents three PMOS transistors in parallel having widths equal to 1 $\mu$m and lengths equal to 11 $\mu$m.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A static memory system, comprising:
    at least two memory elements;
    a write circuit that stores a charge on at least one of the at least two memory elements, the charge representing a data value; and
    a read circuit that continually detects the charge stored on the at least one memory element and continually translates the charge into a logic value indicative of the data value while the static memory system is powered on without using a read signal that specifies a dedicated read cycle.

2. The static memory system of claim 1, further comprising a switch circuit that enables the write circuit.

3. A static memory system, comprising:
    at least two memory elements;
    a write circuit that stores a charge on at least one of the at least two memory elements, the charge representing a data value; and
    a read circuit that continually detects the charge stored on the at least one memory element and continually translates the charge into a logic value indicative of the data value while the static memory system is powered on, the read circuit comprises:
    a current steering circuit that directs a flow of a current based on the at least one memory element that has the charge stored thereon; and
    a detection and translation circuit that is coupled to the current steering circuit and is configured to detect the current and translate the current into the logic value.

4. The static memory system of claim 3, wherein the detection and translation circuit comprises a first current mirror, a second current mirror, and a third current mirror, the first, second, and third current mirrors are configured to output the logic value at a voltage level corresponding to a voltage at one of two rails.

5. The static memory system of claim 4, further comprising an inverter, wherein the first, second, and third current mirrors and the inverter are configured in a manner to disallow feed through current through the inverter.

6. The static memory system of claim 3 wherein the current steering circuit comprises a current source coupled to a differential pair.

7. The static memory system of claim 6, wherein the differential pair includes two of the at least two memory elements.

8. The static memory system of claim 6, wherein the differential pair includes a first and a second transistor having dimensions similar to the at least two memory elements.

9. The static memory system of claim 6, further comprising a first cascode transistor coupled to the differential pair and a first current mirror and a second cascode transistor coupled to the differential pair and a third current mirror, the first and second cascode transistors are biased at a substantially constant voltage and are configured to prevent an accidental write to the at least two memory elements.

10. A circuit for reading a memory system, comprising:
    a first circuit that continually steers a current through the memory system while the memory system is powered on; and
    a second circuit that continually detects the current and translates the current into a logic value representing a data value stored in the memory system while the memory system is powered on.

11. The circuit of claim 10, wherein the first circuit includes a current source transistor having a gate that is biased at a first substantially constant voltage and a source connected to a power supply such that the current-source transistor conducts the current.

12. The circuit of claim 11, wherein the current is substantially constant.

13. The circuit of claim 11, wherein the first circuit further includes a first memory element and a second memory element, a gate of both the first memory element and the second memory element is floating, a source of the first memory element and the second memory element is connected to a drain of the current-source transistor such that the current flows through the first memory element and the second memory element based on which of the respective gates is storing a charge that represents the data value.

14. The circuit of claim 13, further comprising a switching transistor having a source connected to the power supply, a drain connected to a source of the first memory element and a source of the second memory element such that the switching transistor couples the first memory element and the second memory element to the power supply when a write cycle is being performed.

15. The circuit of claim 10, wherein the second circuit includes a first current mirror, a second current mirror, and a third current mirror that are configured to output the logic value at a voltage level corresponding to a voltage at one of two rails.

16. The circuit of claim 15, further comprising an inverter, wherein the first, second, and third current mirrors and the inverter are configured in a manner that disallows feed through current in the inverter.

17. The circuit of claim 15, wherein the second circuit further includes a first cascode transistor coupled to a first memory element and the first current mirror and a second cascode transistor coupled to a second memory element and the third current mirror such that the first and second cascode transistors prevent accidental writing to their associated memory element, the gate of the first cascode transistor and the second cascode transistor are biased at a substantially constant voltage.

18. The circuit of claim 10, wherein the first circuit includes a current source transistor having a gate that is biased at a first substantially constant voltage and a source connected to a power supply such that the current-source transistor conducts the current.

19. The circuit of claim 18, wherein the first circuit further includes a differential pair that includes a first differential element and a second differential element, a gate of both the first differential element and the second differential element is coupled to a respective memory element gate which is floating, a source of the first differential element and the second differential element is connected to a drain of the current-source transistor such that the current flows through the first differential element and the second differential element based on which of the respective gates is storing a charge that represents the data value.

20. An apparatus for reading memory systems, comprising:
- a current steering means for continually directing a flow of a current while the memory system is powered on;
- a detection means for continually detecting the current based on a charge that is stored on at least one of at least two memory elements while the memory system is powered on; and
- a translation means for continually translating the current into a logic value indicative of a data value when the memory system is powered on.

21. A method for reading a memory device, comprising:

generating a substantially constant current;

directing the current to flow continually through a differential pair and at least three current mirrors based upon which of at least two memory elements is storing a charge that represents a data value;

detecting the current continually in the at least three current mirrors; and translating the current continually in the at least three current mirrors into a logic value representing the data value.

* * * * *